(12) United States Patent
Kobayashi et al.

(10) Patent No.: US 7,056,129 B2
(45) Date of Patent: Jun. 6, 2006

(54) ANISOTROPICALLY ELECTROCONDUCTIVE ADHESIVE FILM, METHOD FOR THE PRODUCTION THEREOF, AND SEMICONDUCTOR DEVICES

(75) Inventors: Akihiko Kobayashi, Chiba Prefecture (JP); Kazumi Nakayoshi, Chiba Prefecture (JP); Ryoto Shima, Chiba Prefecture (JP); Yoshito Ushio, Chiba Prefecture (JP); Katsutoshi Mine, Chiba Prefecture (JP)

(73) Assignee: Dow Corning Toray Silicone Co., Ltd. (JP)

( * ) Notice: Subject to any disclaimer, the term of this patent is extended or adjusted under 35 U.S.C. 154(b) by 0 days.

(21) Appl. No.: 10/496,558

(22) PCT Filed: Nov. 21, 2002

(86) PCT No.: PCT/JP02/12212

§ 371 (c)(1),
(2), (4) Date: Jun. 9, 2004

(87) PCT Pub. No.: WO03/046098

PCT Pub. Date: Jun. 5, 2003

(65) Prior Publication Data

US 2005/0118845 A1   Jun. 2, 2005

(30) Foreign Application Priority Data

Nov. 28, 2001   (JP)   ............................. 2001-363487

(51) Int. Cl.
*H01R 9/09* (2006.01)
(52) U.S. Cl. ............................................ 439/66; 439/91
(58) Field of Classification Search ................ 439/66, 439/91, 71, 72; 174/262; 428/317; 361/212, 361/769

See application file for complete search history.

*Primary Examiner*—Alexander Gilman
(74) *Attorney, Agent, or Firm*—Robert L. McKellar; McKellar IP Law, PLLC

(57) ABSTRACT

An anisotropically electroconductive adhesive film is characterized by containing an electroconductive elastomer that traverses the thickness of the adhesive film and is insulated in the plane of the adhesive film comprising electrically insulating elastomer, and both the electroconductive elastomer and the electrically insulating elastomer have a modulus of elasticity at 150° C. that is no greater than 100 MPa. A method for producing the anisotropically electroconductive adhesive film is characterized by forming through holes across the thickness of the adhesive film comprising electrically insulating elastomer, thereafter filling the through holes with an electroconductive elastomer composition, and curing the electroconductive elastomer composition to form the electroconductive elastomer after filling the through holes. A semiconductor device characterized by the electrical connection of the terminals of a semiconductor chip to the interconnect pads of an interconnect substrate by the aforementioned anisotropically electroconductive adhesive film.

4 Claims, 3 Drawing Sheets

US 7,056,129 B2

ANISOTROPICALLY ELECTROCONDUCTIVE ADHESIVE FILM, METHOD FOR THE PRODUCTION THEREOF, AND SEMICONDUCTOR DEVICES

TECHNICAL FIELD

This invention relates to an anisotropically electroconductive adhesive film, to a method for producing this film, and to semiconductor devices. More particularly, this invention relates to an anisotropically electroconductive adhesive film capable of effecting the reliable electrical connection of an electronic component, e.g., a semiconductor chip, onto an interconnect substrate. This invention further relates to an efficient method for producing this film. This invention further relates to a reliable semiconductor device that exhibits excellent stress relaxation when exposed to thermal shock, wherein said semiconductor device comprises an electronic component, e.g., a semiconductor chip, that is electrically connected onto an interconnect substrate by the aforesaid film.

BACKGROUND ART

The flip-chip method for the connection of semiconductor chips to interconnect substrates has entered into frequent use in association with the increasingly small size and increasingly higher pin count of semiconductor chips. One problem encountered with this connection method is that the difference in coefficient of thermal expansion between the semiconductor chip and interconnect substrate can produce thermal stresses upon exposure to thermal shock, which results in a degraded reliability. As a consequence, in the case of semiconductor devices in which the semiconductor chip is connected by solder balls to the interconnect substrate, a resin—known as underfill material—is sealed between the semiconductor chip and interconnect substrate as a means for relaxing thermal stresses. This method, however, enlarges the mounting process and hence raises costs.

In view of this, Japanese Laid Open (Kokai or Unexamined) Patent Application Numbers Sho 63-86322 (86,322/1988) and 63-86536 (86,536/1988) teach an anisotropically electroconductive adhesive film in which column-shaped conductors are embedded in a prescribed configuration in a layer of electrically insulating adhesive. These conductors are embedded in such a manner that upon compression bonding they are insulated in the plane of the layer while providing continuity across the thickness of the layer. However, the interconnect reliability is still reduced by thermal shock even when the aforementioned anisotropically electroconductive adhesive film is used to connect the semiconductor chip to its interconnect substrate.

An object of this invention is to provide an anisotropically electroconductive adhesive film that is capable of effecting the reliable electrical connection of an electronic component, e.g., a semiconductor chip, onto an interconnect substrate. An additional object of this invention is to provide an efficient method for producing this film. A further object of this invention is to provide a semiconductor device in which an electronic component, e.g., a semiconductor chip, is electrically connected onto an interconnect substrate by the aforesaid film, wherein said semiconductor device is reliable and exhibits excellent stress relaxation when exposed to thermal shock.

DISCLOSURE OF INVENTION

The anisotropically electroconductive adhesive film according to this invention is characterized by containing an electroconductive elastomer that traverses the thickness of the adhesive film and is insulated in the plane of the adhesive film comprising electrically insulating elastomer, and both the electroconductive elastomer and the electrically insulating elastomer have a modulus of elasticity at 150° C. that is no greater than 100 MPa.

The inventive method for producing anisotropically electroconductive adhesive film is characterized by
forming through holes across the thickness of the adhesive film comprising electrically insulating elastomer,
thereafter filling the through holes with an electroconductive elastomer composition,
and curing the electroconductive elastomer composition to form the electroconductive elastomer after filling the through holes.

A semiconductor device according to this invention is characterized by the electrical connection of the terminals of a semiconductor chip to the interconnect pads of an interconnect substrate by the above-described anisotropically electroconductive adhesive film.

REFERENCE NUMBERS

Figure 1:
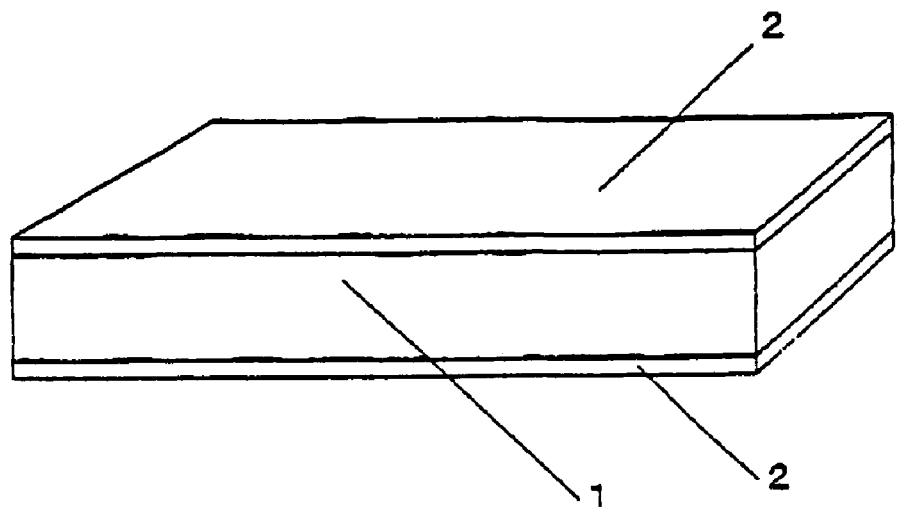
FIG. 1 contains a perspective drawing of the electrically insulating adhesive film carrying a protective film applied on both sides.

1 . . . electrically insulating elastomer
2 . . . protective film
3 . . . through hole
4 . . . electroconductive elastomer composition
5 . . . electroconductive elastomer
6 . . . semiconductor chip
7 . . . terminal
8 . . . interconnect substrate
9 . . . interconnect pad

DETAILED DESCRIPTION OF THE INVENTION

The electrically insulating elastomer has a modulus of elasticity at 150° C. that is no greater than 100 megaPascals (MPa), and particularly preferably is no greater than 10 MPa, in the anisotropically electroconductive adhesive film according to this invention. In case that the modulus of elasticity of the electrically insulating elastomer at 150° C. is above 100 MPa, electrically reliable connection between the terminals of a semiconductor chip to the interconnect pads of an interconnect substrate can not be obtained. This electrically insulating elastomer is, for example, an epoxy resin elastomer, acrylic resin elastomer, polyimide resin elastomer, or silicone elastomer. The epoxy resin elastomer film and the polyimide resin elastomer film taught in Japanese Laid Open (Kokai or Unexamined) Patent Application Number 2000-357697 (357,697/2000), for example, can be used for the adhesive film comprising electrically insulating elastomer in the anisotropically electroconductive adhesive film according to this invention. And the silicone elastomer film taught in Japanese Laid Open (Kokai or Unexamined) Patent Application Numbers Hei 11-12546 (12,546/1999) and 2001-19933 (19,933/2001), for example, can be used for the adhesive film comprising electrically insulating elastomer in the anisotropically electroconductive adhesive film according to this invention. The resistivity of the electrically insulating elastomer is preferably $1 \times 10^6$ ohm-cm or more, and more preferably $1 \times 10^8$ ohm-cm or more. In case that the resistivity is no greater than $1 \times 10^6$ ohm-cm, excellent anisotropic electroconductivity can not be obtained. More specifically, this adhesive film is produced by the crosslinking of a curable elastomer composition and takes the form of a gel or rubber depending on the degree of crosslinking. The electrically insulating elastomer is preferably silicone elastomer because silicone elastomer exhibits stress relaxation when exposed to thermal shock. While the thickness of the adhesive film is not critical, the adhesive film preferably has a thickness of 1 to 5,000 micrometers (μm), more preferably 5 to 1,000 μm, and particularly preferably 5 to 500 μm.

In case that the electrically insulating elastomer is silicone elastomer, a preferred method for producing the adhesive film under consideration comprises crosslinking the curable silicone elastomer composition between substrates that are releasable from the cured product afforded by the composition and that have a larger dielectric constant than this cured product. These releasable substrates can be exemplified by organic resins such as polyether sulfone resins, triacetoxycellulose, polyimide resins, polyester resins, polyether resins, epoxy resins, phenolic resins, and polyamide resins. Substrates of these organic resins may comprise only the organic resin or may be a composite substrate having the organic resin at the surface or in the interior. The shape of the substrate under consideration is not critical and the substrate can be, for example, a block, plate, or film. When in particular the substrate is a film, it can be used as a protective film for the adhesive film. The protective film is then peeled off when attachment of the semiconductor chip to the interconnect substrate is carried out. The adhesive film may also be transferred from this protective film to another type of protective film. The dielectric constant of this second protective film is not critical, and this second protective film can be exemplified by an organic resin film of a fluororesin, polyethylene resin, or polypropylene resin.

The adhesive film under consideration is available, for example, from Dow Corning Toray Silicone Co., Ltd., under the product names FA60 and FA2000.

The anisotropically electroconductive adhesive film according to the invention contains an electroconductive elastomer that traverses the thickness of the adhesive film and is insulated in the plane of the adhesive film comprising electrically insulating elastomer. The electroconductive elastomer has a modulus of elasticity at 150° C. that is no greater than 100 megaPascals (MPa), and particularly preferably is no greater than 10 MPa, in the anisotropically electroconductive adhesive film according to this invention. In case that the modulus of elasticity of the electroconductive elastomer at 150° C. is above 100 MPa, electrically reliable connection between the terminals of a semiconductor chip to the interconnect pads of an interconnect substrate can not be obtained. And the resistivity of the electroconductive elastomer is preferably 1 ohm-cm or less, and more preferably $1 \times 10^{-2}$ ohm-cm or less. In case that the resistivity is greater than 1 ohm-cm, excellent anisotropic electroconductivity can not be obtained. The height of the electroconductive elastomer may be the same as the thickness of the adhesive film or the electroconductive elastomer may protrude so as to form an elevation. The size of the connection area of the electroconductive elastomer is not specifically defined herein because it will depend on the size and spacing of the terminals on the semiconductor chip and the interconnect pads on the interconnect substrate. The shape of the electroconductive elastomer is also not critical and the electroconductive elastomer can be, for example, a cylindrical column, square column, truncated cone, quadrilateral pyramid, string, or ribbon; a cylindrical column is preferred.

The electroconductive elastomer can be exemplified by an electroconductive epoxy resin elastomer, electroconductive acrylic resin elastomer, electroconductive polyimide resin elastomer, or electroconductive silicone elastomer. The electroconductive silicone elastomers are particularly preferred because at the point of interconnecting the semiconductor chip with the interconnect substrate these elastomers readily conform and adhere to the terminals on the semiconductor chip and the interconnect pads on the interconnect substrate and also facilitate adhesion by the adhesive film to the semiconductor chip and interconnect substrate. The electroconductive silicone elastomer can be, for example, an electroconductive silicone rubber or an electroconductive silicone gel.

In case that the electroconductive elastomer is electroconductive silicone elastomer, the electroconductive silicone elastomer under consideration can be produced, for example, by the cure of the electroconductive silicone rubber composition taught in Japanese Laid Open (Kokai or Unexamined) Patent Application Number Hei 3-170581 (170,581/1991). This electroconductive silicone rubber composition is a curable silicone rubber composition that contains metal powder, e.g., of gold, silver, nickel, copper, etc., or a micropowder plated or vapor deposited with such metals. Electroconductive silicone rubber compositions of this type are available, for example, from Dow Corning Toray Silicone Co., Ltd., under the product names DA6524 and DA6525.

The electroconductive elastomer traverses the thickness of the adhesive film comprising electrically insulating elastomer, but is insulated in the plane of this adhesive film. The placement or positioning of the electroconductive elastomer preferably agrees with that of the terminals on the semiconductor chip and the interconnect pads on the interconnect substrate.

This method for producing the anisotropically electroconductive adhesive film is characterized by forming through holes across the thickness of the adhesive film comprising electrically insulating elastomer, thereafter filling the through holes with an electroconductive elastomer composition, and curing the electroconductive composition to form the electroconductive elastomer after filling the through holes.

The electrically insulating elastomer is exemplified by the epoxy resin elastomer, acrylic resin elastomer, polyimide resin elastomer, or silicone elastomer as described above.

The electrically insulating elastomer is preferably silicone elastomer because exhibits stress relaxation when exposed to thermal shock.

Through holes are then formed across the thickness of the adhesive film in the inventive method. The procedure for forming the through holes can be exemplified by punching, laser processing, drilling with a microdrill, and chemical etching. Punching and laser processing are particularly preferred. The through hole-equipped adhesive film can also be produced using a mold that has been preliminarily provided with pins that will result in the formation of the through holes. The curable silicone composition is introduced into and cured in this mold after the interior surface of the mold has been provided with a substrate that is releasable from the cured product afforded by the curable silicone composition and that has a larger dielectric constant than this cured product. The through holes are preferably formed in agreement with the positioning or placement of the terminals of the semiconductor chip and the interconnect pads of the interconnect substrate.

The through holes formed in the adhesive film are subsequently filled with an electroconductive elastomer composition. This electroconductive elastomer composition is exemplified by an electroconductive epoxy resin elastomer composition, electroconductive acrylic resin elastomer composition, electroconductive polyimide resin elastomer composition, or electroconductive silicone elastomer composition. Electroconductive silicone elastomer compositions are particularly preferred because at the point of interconnecting the semiconductor chip with the interconnect substrate they readily conform and adhere to the terminals on the semiconductor chip and the interconnect pads on the interconnect substrate and also facilitate adhesion by the adhesive film to the semiconductor chip and interconnect substrate. The electroconductive silicone elastomer composition can be, for example, an electroconductive silicone rubber composition or an electroconductive silicone gel composition.

The through holes elaborated in the adhesive film can be filled with the electroconductive elastomer composition, for example, by coating the electroconductive elastomer composition on the adhesive film and then filling the through holes with the electroconductive elastomer composition using a squeegee. The electroconductive elastomer composition filled in the through holes needs to be cured. When the electroconductive composition is a heat-curable composition, this curing is preferably carried out for several minutes at a temperature no greater than 150° C.

Figure 2:
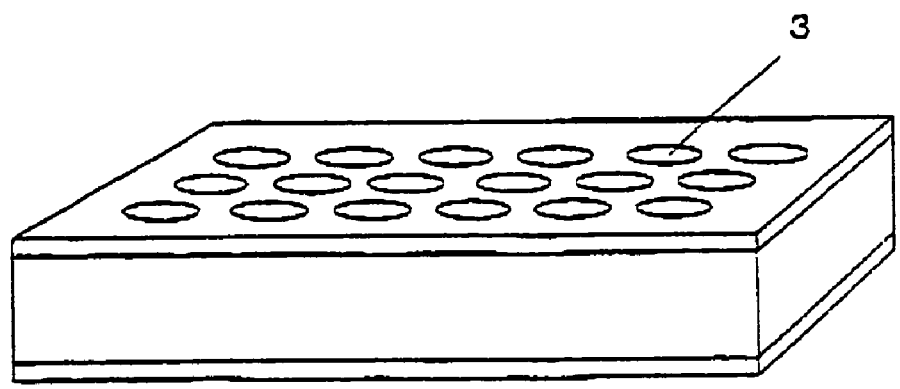
FIG. 2 contains a perspective drawing of the through hole-equipped electrically insulating adhesive film.
Figure 3:
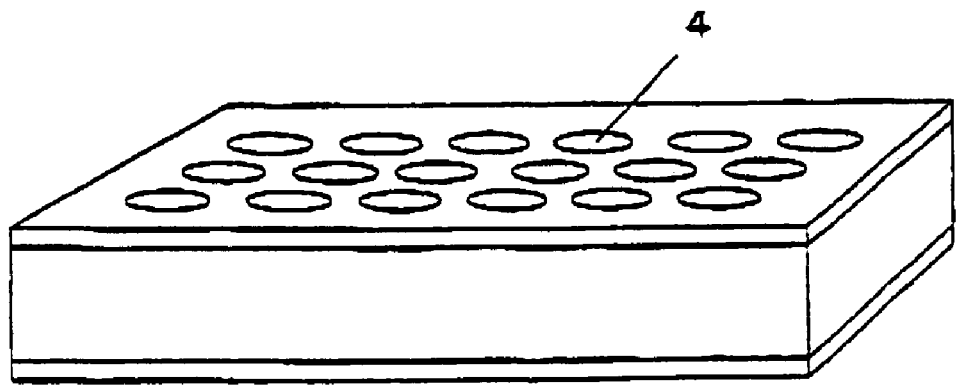
FIG. 3 contains a perspective drawing of the anisotropically electroconductive adhesive film after its through holes have been filled with electroconductive elastomer composition.
Figure 4:
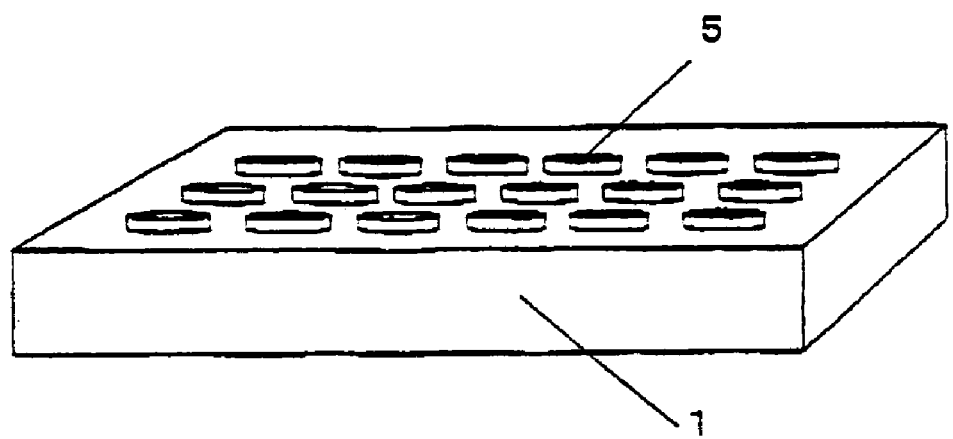
FIG. 4 contains a perspective drawing of the anisotropically electroconductive adhesive film after the protective films applied on its two sides have been peeled off.

The inventive method will now be described with reference to the drawings. FIG. 1 contains adhesive film comprising a protective film 2 adhered on both sides of an electrically insulating elastomer 1. The elaboration of through holes 3 in this adhesive film by punching, laser processing, drilling with a microdrill, chemical etching, etc., produces the adhesive film illustrated in FIG. 2. The adhesive film illustrated in FIG. 3 is produced by coating the through hole 3—equipped adhesive film with an electroconductive elasotomer composition and then filling the through holes using a squeegee. The electroconductive elastomer composition filled in the through holes needs to be cured to form electroconductive elastomere. FIG. 4 illustrates the anisotropically electroconductive adhesive film afforded by peeling off the protective films.

Semiconductor devices in accordance with this invention are characterized by the electrical connection of the terminals of a semiconductor chip to the interconnect pads of an interconnect substrate by the anisotropically electroconductive adhesive film described hereinabove. More specifically, in an inventive semiconductor device a plurality of terminals (bonding pads) on a semiconductor chip and the interconnect pads on the interconnect substrate, said interconnect pads being positioned in correspondence to said terminals, are electrically connected by the conductors in the hereindescribed anisotropically electroconductive adhesive film; the semiconductor chip and circuit substrate are also bonded to each other by the adhesive film. As a consequence, a characteristic feature of the resulting semiconductor device is its ability to thoroughly relax the stress when subjected to thermal shock.

Figure 5:
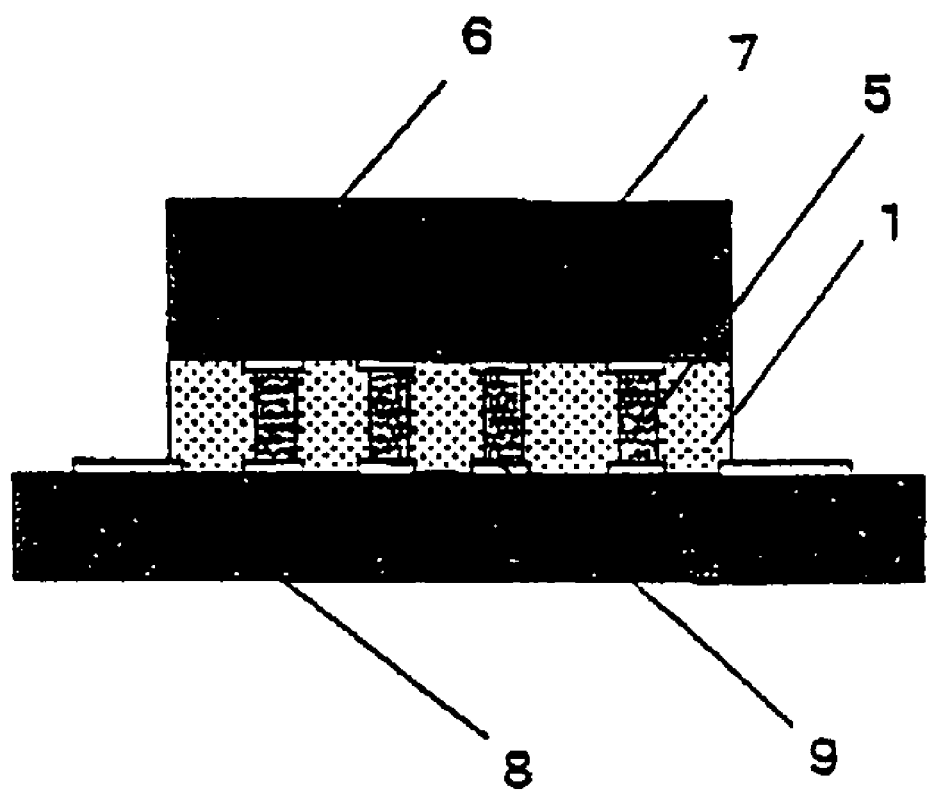
FIG. 5 contains a cross-sectional drawing of a semiconductor device that has been fabricated by making electrical connection between a semiconductor chip and an interconnect substrate using the anisotropically electroconductive adhesive film.

FIG. 5 illustrates the cross section of a semiconductor device that is an example of this invention. In this inventive semiconductor device the terminals 7 of a semiconductor chip 6 are electrically connected by the electroconductive erastomer 5 in the anisotropically electroconductive adhesive film to the interconnect pads 9 of the interconnect substrate 8. The semiconductor chip 6 and interconnect substrate 8 are also bonded to each other by the adhesive film comprising electrically insulating elastomer 1. Such a semiconductor device can be exemplified by devices in which a semiconductor chip is connected to an interconnect substrate such as an epoxy resin-type interconnect substrate, polyimide resin-type interconnect substrate, glass interconnect substrate, or BT resin-type interconnect substrate, for example, bare chip-mounted devices known as COX; devices in which an FC-BGA semiconductor chip is connected to the interconnect substrate; and devices in which an electronic component such as a land grid array (LGA) component is connected to a circuit substrate as described above. Other examples include devices in which the aforementioned epoxy-type printed substrate is connected to a polyimide-type flexible circuit substrate.

The method for fabricating a semiconductor device according to this invention is not critical. In an example of fabrication, the anisotropically electroconductive adhesive film is first attached to the semiconductor chip and the circuit substrate is then attached thereto (or the anisotropically electroconductive adhesive film is first attached to the circuit substrate and the semiconductor chip is then attached thereto) and the resulting heated at a temperature no greater than 200° C. Heating is preferably carried out in this sequence with the semiconductor chip and interconnect substrate pressure-bonded to each other with the aforesaid anisotropically electroconductive adhesive film sandwiched therebetween.

EXAMPLES

The following procedures were used to fabricate the semiconductor devices and evaluate their reliability. The values reported for the physical properties were obtained at 25° C.

Procedure for Fabricating the Semiconductor Devices

Ten semiconductor devices were fabricated as follows: the semiconductor chip (terminal count=100) and an interconnect substrate of epoxy resin were attached to each other with the anisotropically electroconductive adhesive film sandwiched therebetween; heating was then carried out for 2 seconds at 190° C. while pressure-bonding with a force of 1 MPa; and additional heating was subsequently carried out for 1 hour at 170° C. with the pressure released.

Reliability of the Semiconductor Devices 1,000 cycles of thermal shock testing were carried out on the ten semiconductor devices (1 cycle=holding for 30 minutes at −55° C., followed immediately by holding for 30 minutes at 125° C.).

Appearance: The presence/absence of defects such as cracking and delamination was evaluated by inspecting the appearance of the semiconductor devices using a microscope.

Continuity resistance: The continuity resistance was measured at each terminal of the ten semiconductor devices. The continuity resistance was scored as unsatisfactory when the resistance value was equal to or greater than two times its value prior to thermal shock testing.

Moisture resistance: The ten semiconductor devices were subjected to highly accelerated stress testing (HAST) at 135° C./85% RH for 500 hours. After this, continuity testing was carried out on each terminal of the semiconductor devices and the presence/absence of leakage current across the individual terminals was measured. The moisture resistance was scored as unsatisfactory when a leakage current was measured.

Example 1

Through holes (diameter=100 µm) were produced with a spacing of 200 µm by punching a 50 µm-thick electrically insulating silicone rubber adhesive film (product name: FA60, from Dow Corning Toray Silicone Co., Ltd., durometer=50 (using a type A durometer as specified in JIS K 6253), modulus of elasticity at 150° C.=1.8 MPa, resistivity at 25° C.=1×10$^{15}$ ohm-cm) that carried a 50 µm-thick polyether sulfone (PES) film on one side and a 35 µm-thick PES film on the other side. This adhesive film was thereafter coated with an electroconductive silicone rubber composition (product name: DA6524, from Dow Corning Toray Silicone Co., Ltd.,) that was curable to make a silicone rubber (durometer=83 (using a type A durometer as specified in JIS K 6253), modulus of elasticity at 150° C.=4 MPa, resistivity at 25° C.=4×10$^{-4}$ ohm-cm), and this electroconductive silicone rubber composition was filled into the through holes using a squeegee. Heating for 1 minute at 150° C. then gave the anisotropically electroconductive adhesive film.

Semiconductor device fabrication was carried out by first peeling off the PES films bonded on the two surfaces of the anisotropically electroconductive adhesive film and then bonding the semiconductor chip and interconnect substrate together. The semiconductor device reliability is reported in Table 1.

Example 2

Using a carbon dioxide laser (YB-HCS01 from Matsushita Denki Sangyo Kabushiki Kaisha), through holes (diameter=100 µm) were produced with a spacing of 200 µm in a 50 µm-thick electrically insulating silicone rubber adhesive film (product name: FA60, from Dow Corning Toray Silicone Co., Ltd., durometer=50 (using a type A durometer as specified in JIS K 6253), modulus of elasticity at 150° C.=1.8 MPa, resistivity at 25° C.=1×10$^{15}$ ohm-cm) that carried a 50 µm-thick polyether sulfone (PES) film on one side and a 35 µm-thick PES film on the other side. This adhesive film was thereafter coated with an electroconductive silicone rubber composition (product name: DA6524, from Dow Corning Toray Silicone Co., Ltd.) that was curable to make a silicone rubber (durometer=83 (using a type A durometer as specified in JIS K 6253), modulus of elasticity at 150° C.=4 MPa, resistivity at 25° C.=4×10$^{-4}$ ohm-cm), and this electroconductive silicone rubber composition was filled into the through holes using a squeegee. Heating for 1 minute at 150° C. then gave the anisotropically electroconductive adhesive film.

Semiconductor device fabrication was carried out by first peeling off the PES films bonded on the two surfaces of the anisotropically electroconductive adhesive film and then bonding the semiconductor chip and interconnect substrate together. The semiconductor device reliability is reported in Table 1.

Example 3

Through holes (diameter=100 µm) were produced with a spacing of 200 µm by punching a 50 µm-thick electrically insulating epoxy resin adhesive film (modulus of elasticity at 150° C.=10 MPa, resistivity at 25° C.=1×10$^{14}$ ohm-cm) that was fabricated based on the example provided in Japanese Laid Open (Kokai or Unexamined) Patent Application Number 2000-357697 (357,697/2000), and was carried a 50 µm-thick polyethylene terephthalate (PET) film on one side and a 50 µm-thick PET film on the other side. This adhesive film was thereafter coated with an electroconductive epoxy resin composition that was prepared based on the example provided in Japanese Laid Open (Kokai or Unexamined) Patent Application Number Hei 9-194813 (194813/1997) and was curable to make a cured epoxy resin (modulus of elasticity at 150° C.=30 MPa, resistivity at 25° C.=8×10$^{-3}$ ohm-cm), and this electroconductive epoxy resin composition was filled into the through holes using a squeegee. Heating for 1 minute at 150° C. then gave the anisotropically electroconductive adhesive film.

Semiconductor device fabrication was carried out by first peeling off the PET films bonded on the two surfaces of the anisotropically electroconductive adhesive film and then bonding the semiconductor chip and interconnect substrate together. The semiconductor device reliability is reported in Table 1.

Comparative Example 1

As a replacement for the anisotropically electroconductive adhesive film used in Example 1, an anisotropically electroconductive adhesive film was fabricated based on the example provided in Japanese Laid Open (Kokai or Unexamined) Patent Application Number Sho 63-86536 (86,536/1988). This film was composed of polyarylate resin (modulus of elasticity at 150° C.=2500 MPa) as the insulating adhesive and column-shaped conductors fabricated by plating Au, Cu, and Au (modulus of elasticity at 150° C.=20000 MPa) in the sequence given. Semiconductor devices were fabricated by effecting connection by compression-bonding for 5 seconds at 250° C. and 89 g/pin. The reliability of these semiconductor devices is reported in Table 1.

TABLE 1

|  | Example 1 | Example 2 | Example 3 | Comp. Ex. 1 |
|---|---|---|---|---|
| number found to be defective in the inspection of appearance | 0/10 | 0/10 | 0/10 | 6/10 |
| continuity | Good | Good | Good | Unsatisfactory |
| moisture resistance | Good | Good | Good | Unsatisfactory |

INDUSTRIAL APPLICABILITY

The anisotropically electroconductive adhesive film according to this invention is characterized by its ability to provide the highly reliable electrical connection of an electronic component, e.g., a semiconductor chip, onto an interconnect substrate. The inventive method for producing this anisotropically electroconductive adhesive film is characterized by its ability to produce this film very efficiently. Semiconductor devices according to this invention, because they employ the inventive film to electrically connect an electronic component, e.g., a semiconductor chip, onto its interconnect substrate, are characterized by an excellent reliability and an excellent stress relaxation capacity when exposed to thermal shock.

What is claimed is:

1. An anisotropically electroconductive adhesive film characterized by containing an electroconductive elastomer that traverses the thickness of the adhesive film and is insulated in the plane of the adhesive film comprising electrically insulating elastomer, and both the electroconductive elastomer and the electrically insulating elastomer have a modulus of elasticity at 150° C. that is no greater than 100 MPa.

2. The anisotropically electroconductive adhesive film of claim 1, characterized in that the electrically insulating elastomer has a resistivity of at least $1 \times 10^6$ ohm-cm, and the electroconductive elastomer has a resistivity of 1 ohm-cm or less.

3. The anisotropically electroconductive adhesive film of claim 1, characterized in that the electrically insulating elastomer is electrically insulating silicone elastomer.

4. The anisotropically electroconductive adhesive film of claim 1, characterized in that the electroconductive elastomer is electroconductive silicone elastomer.

* * * * *